United States Patent [19]

Oshita et al.

[11] Patent Number: 4,975,800
[45] Date of Patent: Dec. 4, 1990

[54] CONTACT ABNORMALITY DETECTING SYSTEM

[75] Inventors: Youichi Oshita, Katsuta; Akira Hashimoto; Yukio Kurosawa, both of Hitachi; Yoshiaki Inui, Ibaraki; Tokio Yamagiwa, Hitachi, all of Japan

[73] Assignee: Hitachi, Ltd., Tokyo, Japan

[21] Appl. No.: 321,382

[22] Filed: Mar. 10, 1989

[30] Foreign Application Priority Data

Mar. 14, 1988 [JP] Japan .................................. 63-58318
Mar. 16, 1988 [JP] Japan .................................. 63-60411
Sep. 19, 1988 [JP] Japan .................................. 63-232469

[51] Int. Cl.$^5$ ...................... H02H 11/00; G08B 21/00
[52] U.S. Cl. ......................................... 361/113; 361/1; 361/111; 340/644; 324/520
[58] Field of Search ...................... 361/111, 1, 113, 85, 361/182; 340/638, 644, 658; 324/520

[56] References Cited

U.S. PATENT DOCUMENTS

| | | | |
|---|---|---|---|
| 3,801,899 | 4/1974 | Liao | 324/520 |
| 3,887,915 | 6/1975 | Olsen et al. | 361/113 |
| 4,006,410 | 2/1977 | Roberts | 324/520 |
| 4,864,286 | 9/1989 | Ohshita et al. | 340/644 |
| 4,897,754 | 1/1990 | Konishi et al. | 340/644 |

FOREIGN PATENT DOCUMENTS

| | | |
|---|---|---|
| 2702766 | 7/1978 | Fed. Rep. of Germany . |
| 41165 | 9/1978 | Japan . |
| 117421 | 2/1979 | Japan . |
| 68131 | 10/1979 | Japan . |
| 154428 | 12/1980 | Japan . |

OTHER PUBLICATIONS

IEEE Trans. vol. PHS-100, No. 6, Jun. 1981, pp. 2733 to 2739.
Lecture No. 1147, National Conference of the Institute of Electrical Engineers of Japan, bfore 1988.
Electric Contact Techniques by Kinya Tsuchiya, published by Sogo Denshi Shuppan Sha, 7/1980.

Primary Examiner—Todd E. Deboer
Attorney, Agent, or Firm—Antonelli, Terry, Stout & Kraus

[57] ABSTRACT

A contact abnormality detection system for use in a gas-insulated switchgear or other power transmission or distribution apparatus. A gas-insulated switchgear includes a hermetic housing, an insulating gas sealed in the housing, and conductors in the housing having contacts for providing a path for a large current and being electrically insulated from the housing. An abnormality in the contacts causes the contacts to generate vibrations when a large current flows through them. A vibration detector detects vibrations generated by the switchgear including the vibrations generated by the contacts. The frequency spectrum of the vibrations detected by the vibration detector is analyzed to detect if the vibrations contain frequency components in the range of 200 to 500 Hz which meet predetermined criteria. If the vibrations do contain such frequency components, a contact abnormality decision unit decides that the contacts exhibit a contact abnormality, thereby permitting the abnormality to be identified before the contacts fail.

8 Claims, 12 Drawing Sheets

FIG. 16
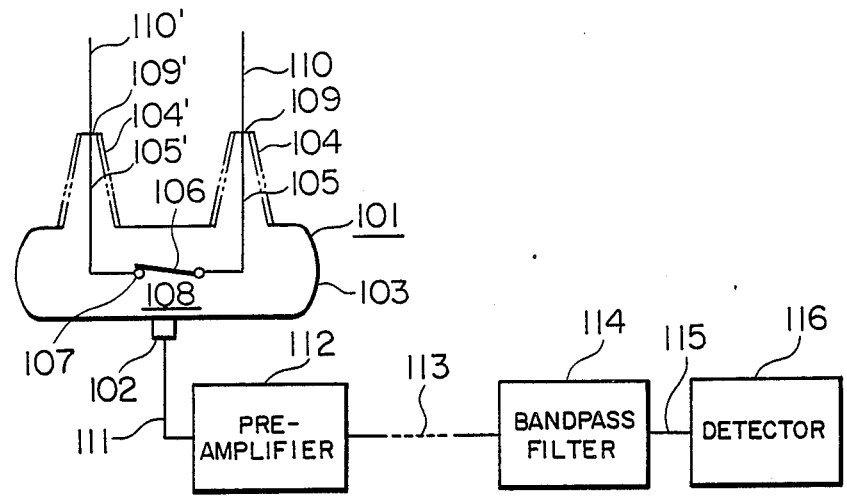
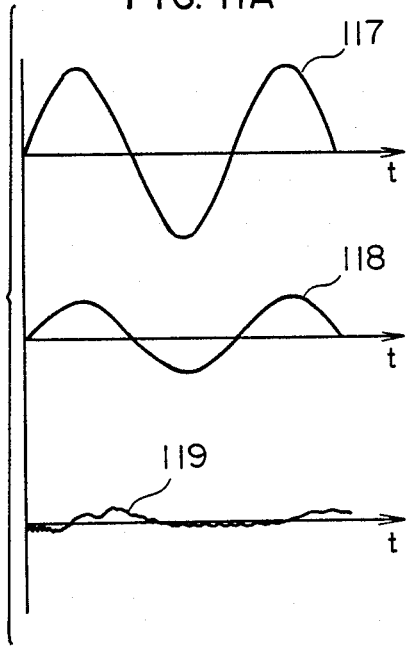
FIG. 17A
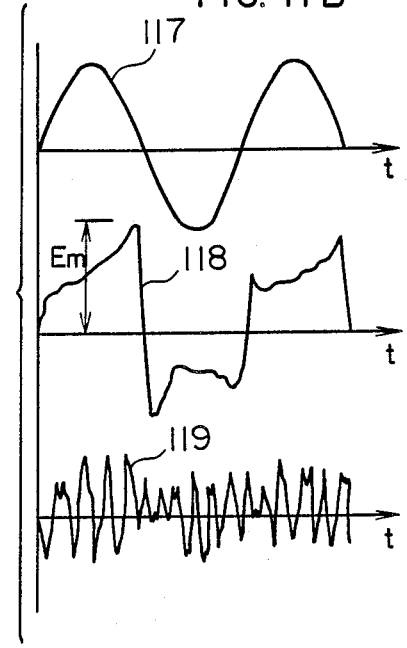
FIG. 17B

CONTACT ABNORMALITY DETECTING SYSTEM

BACKGROUND OF THE INVENTION

The present invention relates to a system for detecting a fault of a power transmission and distribution apparatus such as a gas-insulated switchgear apparatus, or more in particular to an energization fault detection system for disovering at an early time an energization fault including a contact failure due to a contact abnormality in a conductor connection thereby to prevent a serious accident such as grounding.

With the advance of information society, demand for higher power quality is mounting and power transmission and distribution apparatuses such as gas-insulated switchgear apparatus are required to be more and more reliable. In order to meet this demand, a preventive maintenance technique is important for early detection of a fault, if any, and preventing a serious accident such as the grounding. One of the faults to be detected is an energization fault. This fault occurs when a large current flows in a part where a contact failure is caused by (i) the lack of the contacting force due to the insufficient tightening of bolts in the process of assembling a conductor connection, (ii) the shortage of the contact area due to an incomplete throwin attributable to a malfunction of an operating unit of a switching section, or (iii) the damage of the contact area of the contactor of a circuit due to turning off an excessive current. Conventional methods of detecting an energization fault by detecting a temperature increase due to generation of heat at a faulty part are disclosed in JP-A-56-68131 (UT) and JP-A-55-154428. The system disclosed in the former reference, which is equipped with a temperature sensor on the outer wall of an equipment tank for securing reliability, is easily affected by the elements and is low in sensitivity as the sensor thereof is at some distance from a component part subjected to an energization fault, thereby posing the disadvantage of insufficient fault detection accuracy. The latter reference relates to a system with a sensor mounted on a high-potential conductor in order to improve the detection accuracy and gives rise to the problem of low reliability as the sensor maintenance is difficult. If an insulating gas such as $SF_6$ gas sealed in the device housing is exposed to a faulty part increased in temperature, it is decomposed and generates a decomposition gas. A method of detecting such a decomposition gas is disclosed in JP-A-55-41165. In addition to the problem of the sensitivity for detecting a decomposition gas of several ppm and how to secure the reliability against the deterioration by corrosion of the sensor due to the insulating gas, this method has the disadvantage that the overwhelming amount of the decomposition gas generated at the time of current cut-off in a gas section containing a circuit breaker and a disconnector renders this system essentially impracticable. As to other gas sections, the systems available on the market is lacking in sufficient detection sensitivity. A method of detecting an electromagnetic wave or an electrical pulse is disclosed in JP-A-55-117421. An electrical signal detectable by this method is generated in the last stage of progress of a fault when a minute spark discharged begins to occur between electrodes, and therefore even if the fault is detected, it is only several to several tens of seconds before the grounding occurs. Within this short length of time, it would be impossible to prevent the grounding.

Another phenomenon to be detected by a preventive maintenance technique is an insulation failure. One such method based on detection of partial discharge by vibration, hereinafter oscillation, measurement is described in IEEE Trans. on Power Apparatus and Systems Vol. PAS-100, No. 6 (1981) pp. 2733 to pp. 2739. The oscillation referred to in this article is in the frequency range of approximately 10 kHz and less than 10 mG in acceleration generated by partial discharge. This system for detecting such a minute signal of a comparatively high frequency involves an oscillation different in both source and frequency region from the oscillation intended to be detected by the present invention.

The oscillation generated at the time of an energization fault is described in the Lecture No. 1147 before the 1988 National Conference of the Institute of Electrical Engineers of Japan. However, the lecture fails to refer to any method of detection of such an oscillation, or in particular to how to improve the accuracy of detection.

SUMMARY OF THE INVENTION

Accordingly, it is an object of the present invention to provide a contact abnormality detection system, hereinafter an energization fault detection system for detecting an energization fault with high accuracy at an early time which otherwise might adversely affect the system reliability, thereby preventing a serious accident of the transmission and distribution units of a gas-insulated switchgear apparatus or the like.

The object of the invention is attained by measuring the oscillation with an oscillation sensor mounted on the housing of a transmission or distribution apparatus such as a gas-insulated switchgear apparatus, appropriately processing the oscillation thereby to discriminate oscillation components specific to an energization fault from a noise oscillation and deciding on a fault if the abnormal oscillation exceeds a criterion.

The object of the invention is also attained by mounting oscillation detection means such as an acceleration sensor on the outer wall of a gas-insulated switchgear apparatus, providing means for measuring the oscillation of 200 to 5000 Hz in frequency and means for deciding on a fault in accordance with the presence or absence of an oscillation of the corresponding frequency component.

The object of the present invention is also attained by providing oscillation detection means such as an acceleration sensor or a displacement sensor mounted on a gas-insulated switchgear apparatus or the like for measuring an oscillation waveform, frequency analysis means such as a spectrum analyzer or a bandpass filter for analyzing frequency components of an even-numbered multiple of the energization current frequency and a frequency component substantially intermediate adjacent two components of integral multiples, comparator means for comparing these two components to determine the ratio therebetween, and means for deciding on an energization fault when the ratio exceeds a predetermined reference value.

According to one aspect of the invention, an oscillation generated by an energization fault is measured, whereby an energization fault is detected with high accuracy in an early stage of fault development without adversely affecting the reliability of the power transmission or distribution unit involved thereby to permit prevention of a serious accident such as the grounding of a power transmission or distribution unit such as a gas-insulated switchgear apparatus.

According to another aspect of the invention, the oscillation of 200 to 5000 Hz generated in early stages of progress of an energization fault is measured, whereby early and high-accuracy detection of an energization fault is made possible, thereby protecting a gas-insulated switchgear apparatus or the like from a serious accident such as grounding.

According to still another aspect of the invention, an oscillation specific to an energization fault is detected by an oscillation sensor, a frequency component of an even-numbered multiple of an energization current frequency, i.e. a fundamental frequency of an energization current, is compared with a frequency component intermediate integral multiples of the energization current frequency, and when the ratio between these two frequency components exceeds a predetermined setting, a fault is decided by a fault detection algorithm, thereby assuring a high-accuracy detection of an energization fault even under external noises.

BRIEF DESCRIPTION OF THE DRAWINGS

FIG. 16 is a schematic diagram showing a second embodiment of the present invention.

FIGS. 17A, 17B, 19 and 22 are diagrams for explaining the operation of the second embodiment of the invention.

DESCRIPTION OF THE PREFERRED EMBODIMENTS

Figure 1:
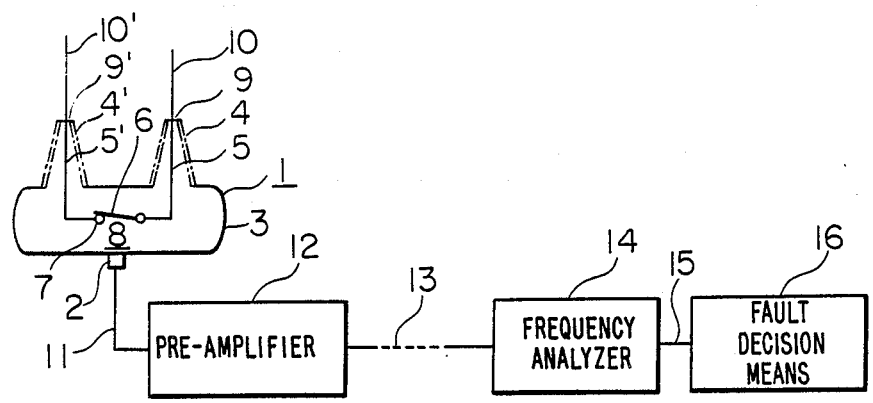
FIG. 1 shows a general configuration of a first embodiment of the present invention.
Figure 3:
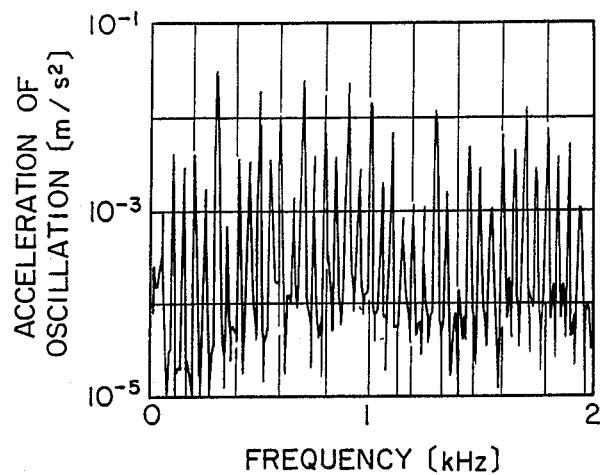

An embodiment of the present invention will be explained below with reference to FIG. 1. A configuration of the present invention as applied to a gas-insulated circuit breaker 1 is shown in FIG. 1. This embodiment comprises an oscillation sensor 2 as oscillation detection means. The circuit breaker 1 comprises a tank 3 making up a hermetically-sealed housing of the earth potential, which contains bushings 4, 4' and hermetic terminals 9, 9' for supporting conductors 5, 5' by hermetic insulation (with an insulative support not shown), and is connected to a breaker unit 8 including a movable electrode 6 and a fixed electrode 7. The circuit breaker 1 is connected outside thereof to a power transmission cable or another power transmission or distribution equipment by external conductors 10, 10' thereby to make up a current path. Tank 3 has generally sealed therein an $SF_6$ gas as an insulating gas under the pressure of about five atmospheres. In this configuration, if an energization fault occurs at some part of the conductors 5, 5' or the breaker unit 8, a fault oscillation is generated. In order to detect such an fault oscillation, the oscillation sensor 2 is installed on the outer wall surface of the tank 3 to monitor the oscillation waveform. The oscillation sensor 2 is mounted preferably by being firmly bolted to an exclusive boss welded to the tank in advance to prevent an adverse effect on the frequency characteristics thereof. The oscillation sensor, if of portable type, would be conveniently secured by magnet on a magnetic part of the tank 3. Since the oscillation noises due to magnetostriction are increased, however, more satisfactory detection is assured if the sensor is secured to the non-magnetic part of aluminum or stainless steel by an exclusive wax or adhesive. An output signal of the oscillation sensor 2 is applied to a frequency analyzer 14 through a cable 11, a preamplifier 12 and a cable 13. The measurement result converted on a frequency axis at the frequency analyzer 14 is applied as a digital signal to a fault decision means 16 through a cable 15 by a transmission procedure such as GPIC. The fault decision means 16 decides whether a frequency as high as an integral multiple of an energization current frequency within a predetermined frequency band contains a sharp peak as shown in FIG. 3 and whether a peak value, if any, exceeds a predetermined reference value, and if these conditions are satisfied, is adapted to issue a fault alarm. In the case of a portable system, the decision may be made visually by the operator watching the pattern displayed on the screen of the frequency analyzer 14. This configuration has all the means for fault detection outside of the circuit breaker unit 1 and therefore has the advantage that routine maintenance and repair of the fault detection system may be conducted without suspending the operation of the main unit. The reliability of the main unit is thus not adversely affected.

The detection system according to the present invention is applicable to conductors in general for supplying a current. In detecting a fault with the oscillation measurement technique available at present, however, an energization current of at least 100 A is required. A lesser current would result in the shortage of the sensitivity of the measuring instrument. The method according to the present invention displays the function thereof in detection of conductor connections visually inaccessible. They are, for example, conductor connections in a hermetically-sealed housing or impressed with a high voltage. For this reason, the present invention is effectively applied to fault detection of a gas-insulated switchgear apparatus with units installed within a hermetically-sealed housing.

Figure 4:
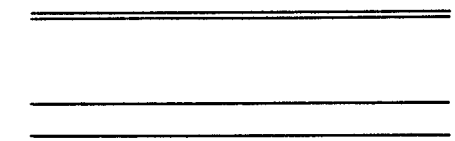
FIG. 4 is a sectional view showing a part of the configuration shown in FIG. 1.

FIG. 4 shows an embodiment of the invention as related to the place of sensor installation. An oscillation sensor 2 is adhered on the flat surface of a boss 40 mounted on the tank 3. A displacement sensor, a speed sensor or an acceleration sensor may be used for oscillation measurement. In spite of the basic similarity of these sensors, an acceleration sensor is used in the present embodiment for its handling ease. As mentioned above, a signal waveform appears for a frequency lower than 5 kHz, and an oscillation noise increases for a frequency below 200 Hz. In view of this, the frequency characteristic of an oscillation sensor should preferably be at least 5 or the capacity to measure the frequency components of at least 200 Hz is necessary. An output signal of the oscillation sensor is connected through a cable 11, a pre-amplifier 12 and a cable 13 to an E/O (electro-optic) converter and is transmitted to a frequency converter means by an optical fiber cable 18. This set of these units is housed in a metallic shield case 19 which also functions as water-proofing means. The cables 11 and 13 are normally formed coaxially in order to alleviate the effect of an induction noise. Even after these means, the cable 11 small in signal level sometimes poses a problem. These means are housed in the shield case 19 which doubles as a water-proofing means. The shield case 19 is required to be a conductor, or preferably a magnetic material such as iron. It is more effective and preferable to make the case 19 of a double structure of high conductors such as an iron magnetic material and copper. The shield case 19 is mounted on the boss 4 through a packing 20 resistant to vibrations due to the magnetostrictive oscillation generated in the shield case 19. The shield case 19 should be connected to the tank 3 with a conductor 21 to keep the whole structure at an equal potential. This is because a switching surge voltage of about 5 KV may be generated in the tank 3 at the time of operation of the switching unit. In the meantime, the pre-amplifier 12 and the E/O converter are preferably connected to a power supply made up of a battery for noise protection. If a commercial power supply is used, however, it is recommended to raise it by using an insulation transformer for protection. According to the embodiment under consideration, the sensor and the pre-amplifier are contained in a single housing, and therefore the connecting cable easily affected by induction noises is minimized in length as well as reducing the effect of induction noises by the shield. Further, the surge resistance is improved by keeping the whole structure at an equal potential.

Figure 5:
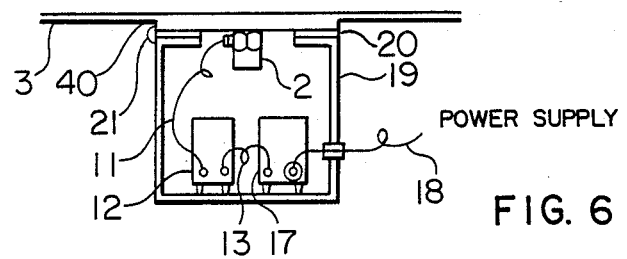
FIG. 5 is block diagram showing a modification of the configuration of FIG. 1.

FIG. 5 shows a configuration of an embodiment comprising a transmission section to which an optical fiber cable is applied. An output signal of an oscillation sensor 2 mounted on a tank 3 is applied through a pre-amplifier 12 to an E/O converter 17, an optical fiber cable 18, an O/E (opto-electric) converter 22, a frequency analyzer 14 and a fault decision means 16. In this configuration, as mentioned above, the detection section made up of the oscillation sensor 2 and the pre-amplifier 12 is capable of being kept at a potential independent of other measurement systems, thereby improving the surge resistance at a potential equal to that of the tank 3, while at the same time permitting optical transmission basically free of induction noises in a comparatively long distance of about several tens of meters between the pre-amplifier 12 and the frequency analyzer. Furthermore, in monitoring a multiplicity of points at the same time by use of a plurality of oscillation sensors 2, each sensor is independent in potential, thereby eliminating the fear of multiple groundings.

In constructing a measurement system in this way, the resolution of the system as a whole is preferably not more than the background noise level of $10^{-5}$ m/s². It should be noted that unless it is $10^{-2}$ m/s² or less in the worst case, it is impossible to detect the oscillation generated by an energization fault to be measured according to the present invention. When a displacement sensor or a speed sensor is used as an oscillation sensor, on the other hand, it is necessary to make sure that an equivalent or higher resolution could be obtained by conversion.

Figure 6:
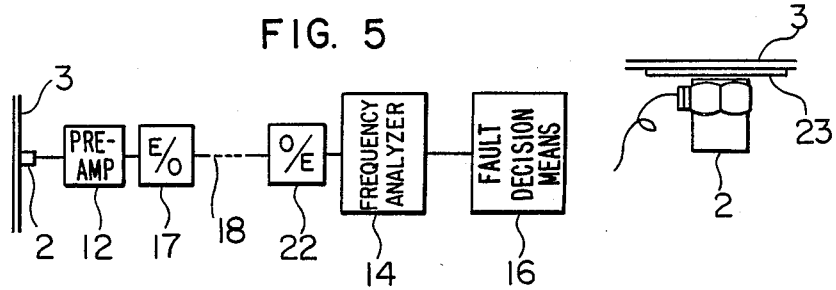
FIG. 6 is a front view of the essential parts of another modification of the configuration of FIG. 5.

FIG. 6 shows an embodiment in which an electrical insulation is obtained with the tank at an oscillation sensor when an electrical transmission system is used, in which case an oscillation sensor 2 is adhered to the tank 3 with an insulating plate 23 therebetween.

Figure 7:
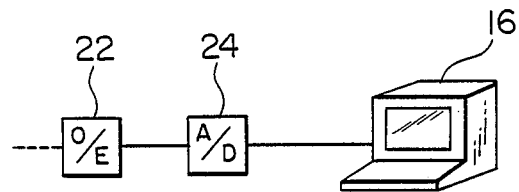
FIGS. 7 to 9 ar block diagrams showing different decision sections.

FIG. 7 shows a different embodiment of the decision section. A signal sent from a detector is restored into an electrical signal by an O/E converter 22 and after being converted into a digital signal at an A/D (analog to digital) converter 24, is applied directly to a fault decision means 16. The fault decision means 16 subjects the data thus received to the operation of FFT (Fast Fourier Transform) thereby to obtain an intended frequency characteristic. This method delays the computation speed somewhat as compared with the method using an exclusive frequency analyzer but has the advantage of being capable of constructing a system at low cost.

Figure 8:
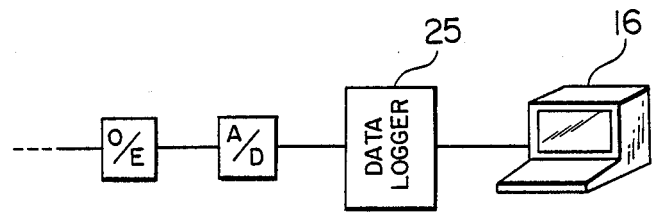

FIG. 8 is a diagram showing the aforementioned embodiment comprising a data logger 25 as a buffer capable of collecting data at high speed in the stage before the fault decision means 16. If the frequency is to be analyzed up to 5 kHz, data is required to be collected at a sampling rate of about several tens of microseconds. Depending on the type of the computation unit used with the fault decision means 16, however, the collection speed may be lower than that. This embodiment is effectively used in such a case.

Figure 9:
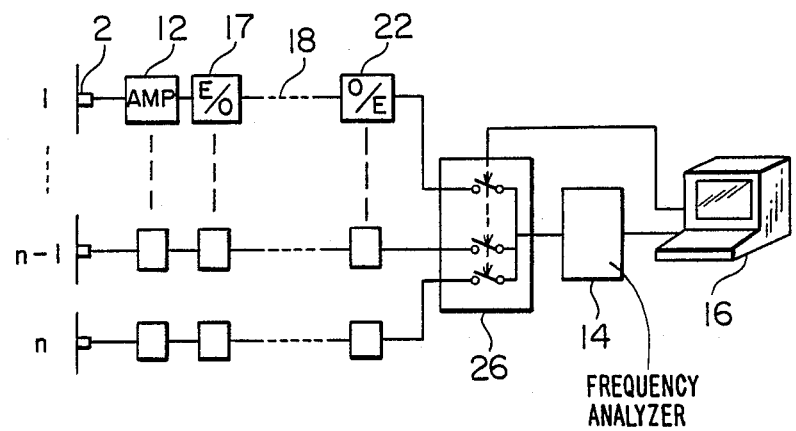

An embodiment in which a multiplicity of detectors are monitored with a single set of decision means is shown in FIG. 9. An n-channel detector including an oscillation sensor 2 and a pre-amplifier 12 is connected through a transmission section including an E/O converter 17, an optical fiber cable 18 and an O/E converter 22 to a decision means including a frequency analyzer 14 and a fault decision means 16 by way of a switch box 26. The switch box 26 is capable of controlling by switching the connection through the fault decision mean 16 and adapted to sequentially switch the measurement results for the n channels for frequency analysis and fault decision. This configuration meets the system requirements with an increased scale of units to be subjected to fault detection requiring measurement of an increased number of points simply by increasing the number of detectors, thereby minimizing the increase in the number of units involved.

Figure 10:
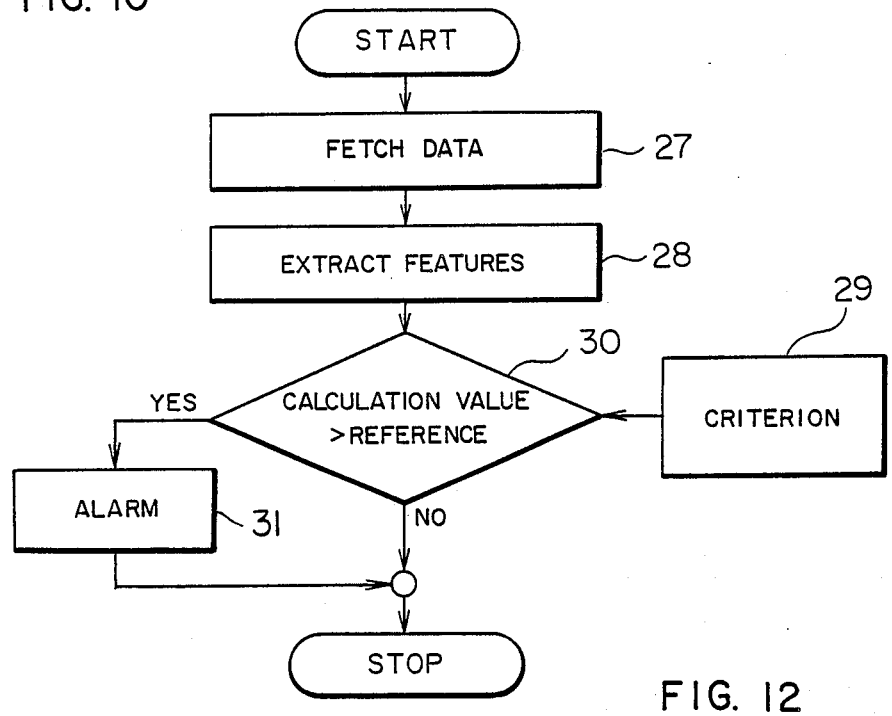
FIGS. 10 to 13 are flowcharts for the decision means.

A fault decision algorithm for a fault decision means is shown in FIG. 10. Upon initiation of series of sequences, a data subjected to frequency analysis is retrieved from a data retrieval routine 27. In the embodiment of FIG. 5 with a frequency analyzer separately provided, the data is retrieved by a transmission procedure such as GPIB, while the result is used directly in frequency analysis within the fault decision means 16 according to the embodiment shown in FIG. 7. In response to the result, a feature extraction routine 28 extracts the oscillation component due to an energization fault, which is compared with a reference value produced from a decision reference decision routine 29 at a comparator routine 30, so that if the oscillation component is less than the reference value, a series of sequences is completed, while if the oscillation component is more than the reference value, an alarm is issued at an alarm generation routine 31 thereby to end the series of sequences. This configuration makes it possible to issue an alarm when a fault makes steady progress and reaches a predetermined level.

Figure 11:
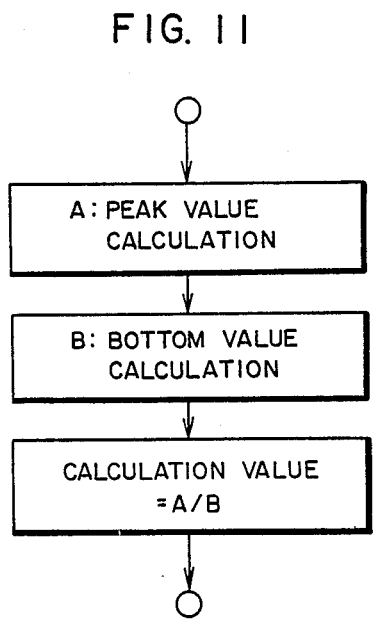
Figure 12:
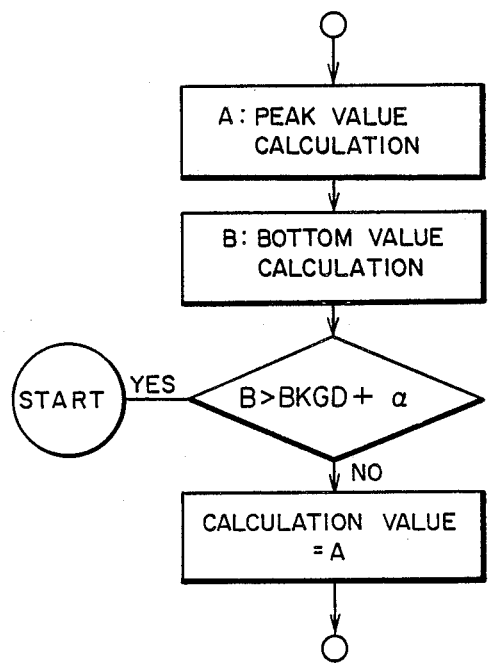

Examples of the configuration of a feature extraction routine are shown in FIGS. 11 and 12. An example for making evaluation with a relative value is shown in FIG. 11, and an example using an absolute value for evaluation in FIG. 12. In both cases, the quantity A associated with a sharp peak and the quantity B corresponding to the bottom value of the result of frequency analysis shown in FIG. 3 are required to be produced. This is in order to discriminate a raised level remaining flat on the frequency axis on rainy days or the like. The value A is preferably an average of integral multiples or even-numbered multiples of a commercial frequency within a predetermined frequency range. The frequency range should be set below 5 kHz which is an upper limit at which an oscillation associated with an energization fault is detectable but more than 200 Hz which is a lower limit where the oscillation becomes conspicuous due to an electromagnetic force or the like. The value A in this case, therefore, assumes an average of oscillation levels in 400, 500, ...., 1900, 2000 Hz for the commercial frequency of 50 Hz. In addition, there are methods in which several points from the largest peaks are sampled and averaged out or a predetermined frequency value is used. As long as the setting is proper, however, the result obtained is not much different. The value B, on the other hand, is taken as an average for other than frequencies associated with peaks and, in the case shown above, assumes an average of the values including 425, 475, 525, ...., 1975 Hz. The ratio between the values A and B thus obtained is determined in FIG. 11. This ratio increases with the progress of an energization fault. In an oscillation attributable to other causes, a sharp peak as shown in FIG. 3 does not appear, so that the values A and B increase at the same time and the resulting computation value does not increase, thereby causing no false operation. In the process, the criterion shown in FIG. 10 is properly about ten times or is required to be at least five times. If this criterion is too small, a false operation would result. In an area with small environmental noises, the signal level rises relatively and it is necessary to set this value at a somewhat high level. According to the method of FIG. 12, the measurement is eliminated from decision on the criterion and measurement is conducted again if noises are large due to the rain or the like, that is, if the value B is large. In the method of detection according to the present invention, by contrast, the grounding does not normally occur before the passage of several tens of days, and therefore even the decision is impossible for some length of period due to the rain or the like, there is no need to worry but priority is given to preventing a false operation. The criterion for the value B is determined taking the tolerance $\alpha$ into consideration allowing for the ambient noise level BKGD. Normally, this value takes less than $10^{-4}$ m/s$^2$, but varies with the equipment environment, and therefore should be actually measured before installation. It is also effective if the learning function is given to the system. Although the value A is determined by computation subsequent to the decision, the value A/B may alternatively be substituted in the same manner as in FIG. 11. The reference value of FIG. 10 with the computation value as A is set within the range from $10^{-4}$ to $10^{-2}$ m/s$^2$. This method makes it possible to discriminate random noises caused by the operation of a switching gear or such phenomena as rains or the construction work in the ambience from the oscillation generated in association with an energization fault shown in FIG. 3 in a fault decision process.

Figure 13:
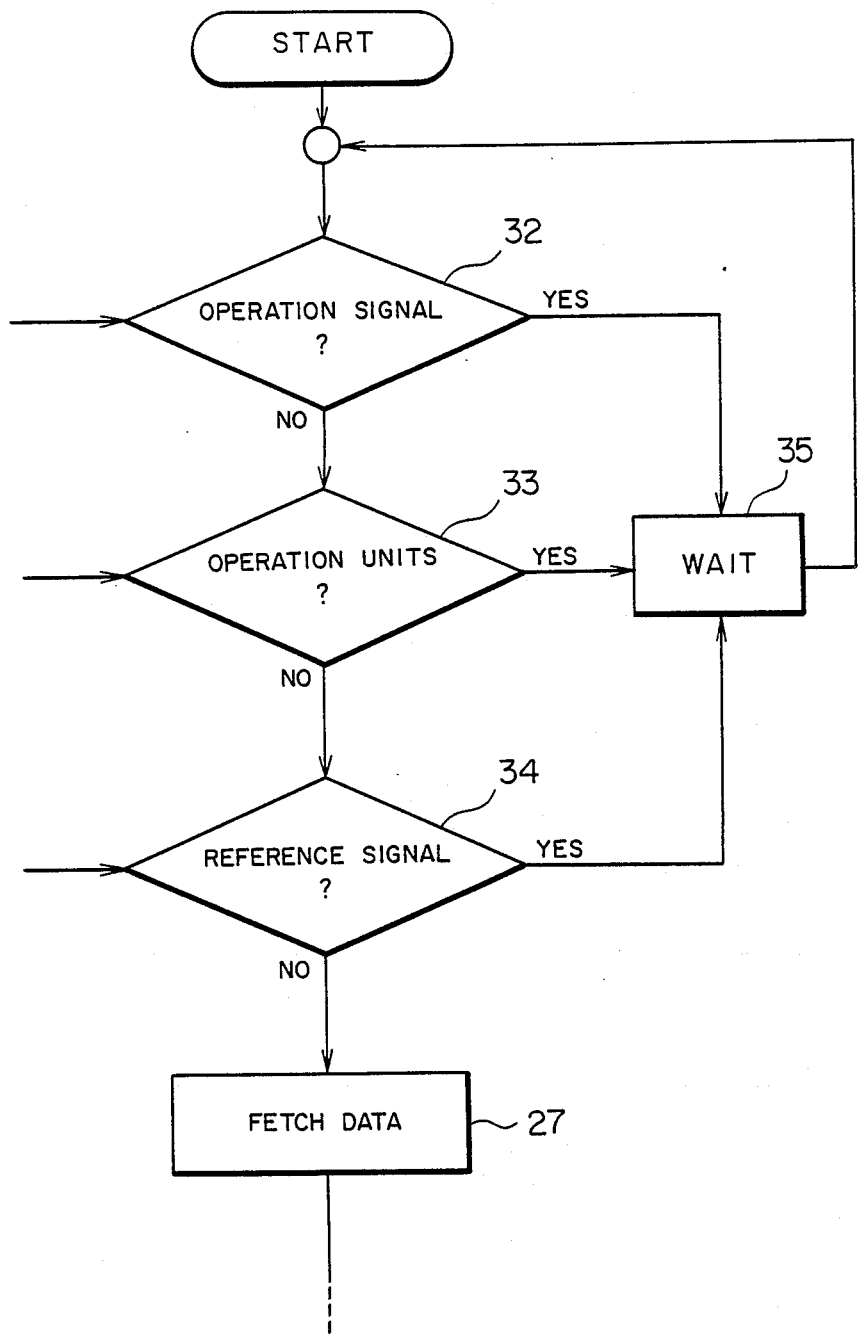

FIG. 13 shows an embodiment effective for improving the fault detection reliability by preventing a false operation. This embodiment is such a modification of FIG. 10 that various decision means 32, 33 and 34 are inserted in the stages before the data retrieval means 27. The first decision means 32 makes decision on the basis of a very large oscillation caused upon actuation of the circuit breaker or disconnector within the gas-insulated switchgear apparatus. Since these operations are based on an operation command signal, a decision made on whether these operation signals are produced before a fault decision permits the above-mentioned oscillations to be eliminated from a fault decision. The second decision means 33 is for discriminating the oscillation generated at the time of operation of a hydraulic pump of the operation unit. This oscillation, which occurs within the equipment like the previously-mentioned oscillation, lasts as long as several tens of seconds. This operating condition can be determined by monitoring the voltage of a drive power supply, and therefore a fault decision on this operation is avoided during the operation. The third decision means 34 is for eliminating the oscillation originating from an external source, especially, the construction work or the like in the ambience. A dummy oscillation sensor having characteristics similar to those of a genuine oscillation sensor is installed in the vicinity of the equipment to detect the magnitude of the external oscillation. When this oscillation is large, the fault decision process is suspended. When any of the above-mentioned three conditions is satisfied, the same sequence is repeated through a delay loop 35. Generally, a practicable detection accuracy is achieved by the method for detecting a pattern specific to an energization fault according to the embodiment of FIG. 10. The embodiment under consideration, on the other hand, is capable of avoiding a fault decision and thus preventing a false trip liable to be caused by a large oscillation noise.

Figure 14:
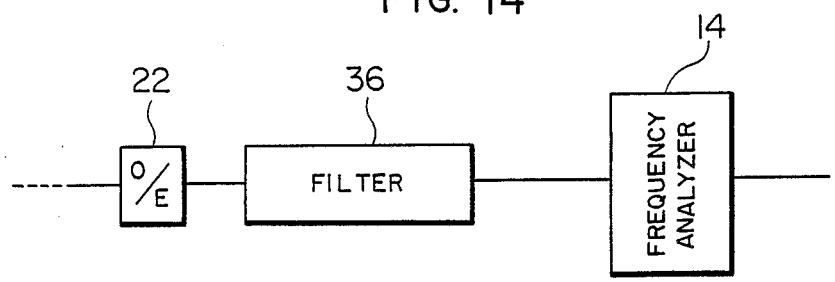
FIG. 14 is a block diagram showing a modification different from FIG. 5.

FIG. 14 shows still another embodiment, which further comprises a high-pass filter 36 inserted between the O/E converter 22 and the frequency analyzer 14 in the embodiment of FIG. 5. When a normal or abnormal condition is low in degree, the oscillation detected is due to the electromagnetic force or the like and the components less than 20 Hz are controlling. Due to the limitation of the dynamic range of the frequency analyzer 14, analysis of a very small high frequency component would develop a considerable error. By eliminating the low-frequency oscillation components by the filter 36, this problem is obviated making it possible to detect a signal in initial stages of a fault with high accuracy.

Another method effective for an improved detection accuracy is an averaging process. Data are superimposed and added to each other and the sum is divided by the number of additions. An ordinary frequency analyzer incorporates this function as a standard equipment, and twenty to several hundred times of averaging processes are desirable. This eliminates spontaneous or irregular oscillation components, and therefore it is possible to recover only a continuous signal such as an oscillation component associated with an energization fault.

Figure 15:
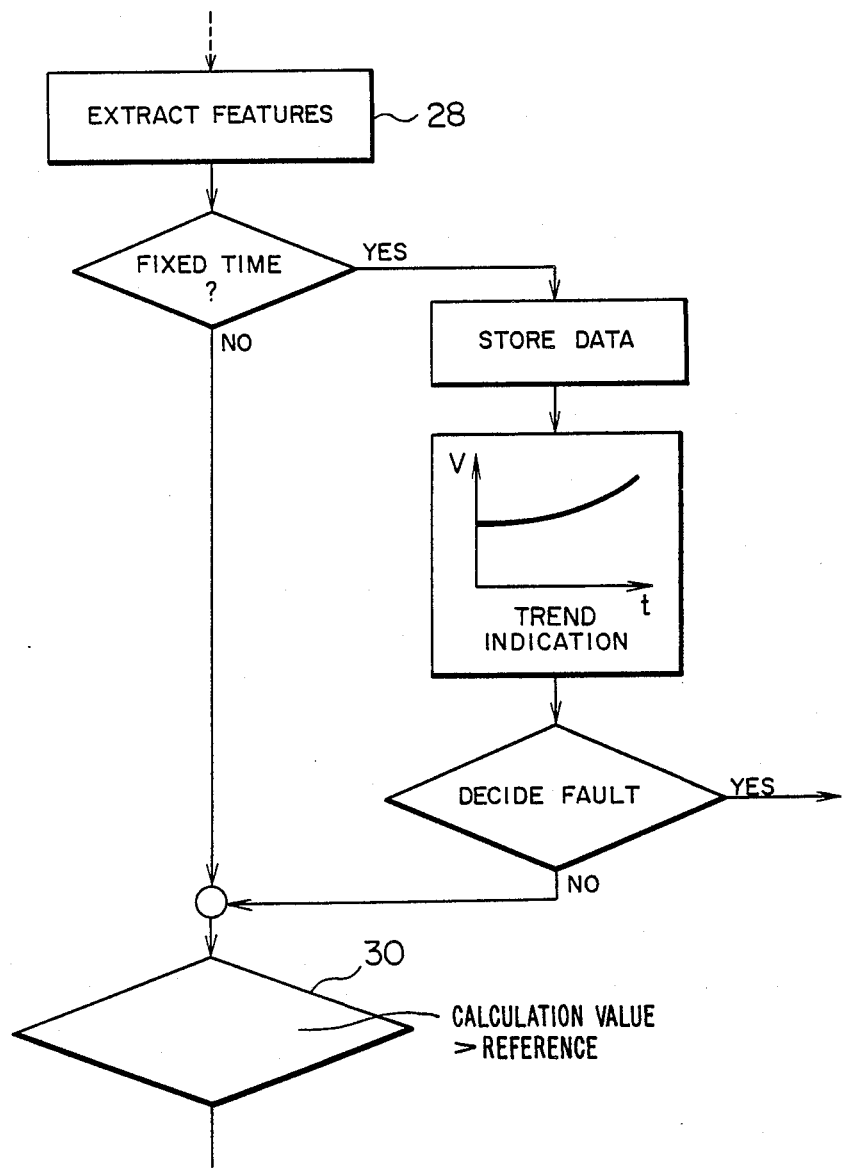
FIG. 15 is a flowchart for a modification of FIG. 10.

The past history data is an effective information for improving the fault detection sensitivity or accuracy. For this purpose, the calculation value with the feature extracted in the embodiment and the like of FIG. 10 is required to be recorded in subsequent steps as shown in the embodiment of FIG. 15. In order to prevent the amount of data from being increased enormously, only regular data set several times for each day are stored. A magnetic disk should desirably be used as a storage medium for its reproduction ease. The data thus recorded included, in addition to the date, measurement points and sensor numbers, the peak value, bottom value and the quotient thereof, etc. determined from FIG. 11. If there is still sufficient space of storage, recording of as much result of frequency analysis as possible would be useful for subsequent analyses. In the next step, the trend is determined and indicated for the past on to several months. In the process, the conditions for energization current should desirably be uniform, and therefore measurement data for the same time should be compared. In spite of considerable data variations, many measurement values makes it possible to express the trend numerically by determining the inclination by means of the minimum square method. If the peak value is increased by $10^{-3}$ m/s$^2$ for a given month, care should be taken, and in such a case, a fault is decided with an alarm issued. By so doing, a high-sensitivity fault detection becomes possible in an earlier fault progress stage. By indicating the trend, on the other hand, the inspector can grasp the situation accurately by checking visually if an alarm is issued.

If an oscillation is to be measured and an energization fault is to be detected with high accuracy, it is necessary to grasp accurately the characteristics specific to an oscillation that occurs at the time of an energization fault. The various experience and data obtained from various experiments conducted by causing an artificial contact failure at a conductor connection and thus supplying a large current of one hundred to several thousand amperes by use of a gas-insulated switchgear apparatus are described briefly below.

(1) The oscillation caused at the time of an energization fault begins to be accelerated with the increase in the interpole voltage of the faulty part (voltage drop between conductors) exceeding about 0.1V.

(2) No melting trace or discharge trace is left at the faulty energization part at an interpole voltage lower than the melting voltage of a conductor material (0.43V for copper and 0.37V for silver). In other words, the above-mentioned oscillation is not caused by discharge. According to the detection method under consideration, therefore, it is possible to detect initial stages of progress of an energization fault.

Figure 2A:
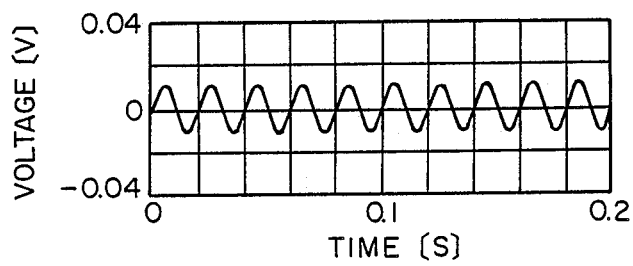
FIGS. 2A, 2B and 3 are diagrams showing phenomena providing a basis of the present invention.
Figure 2B:
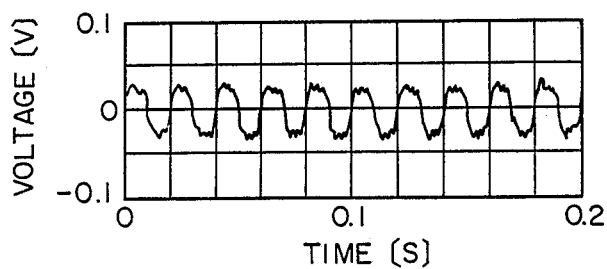

(3) A faulty energization part is either in stable or unstable state. In the former state, the interpole voltage takes a somewhat distorted sinusoidal waveform with a comparative long duration as shown in FIG. 2A, while in the latter state, the interpole voltage waveform is distorted with a sudden change at zero current point as shown in FIG. 2B normally with a duration as short as less than several seconds.

(4) The feature of the oscillation in stable state mentioned above will be explained. In FIG. 3 showing an example of the result of frequency analysis, a sharp peak appears at an integral multiple or especially at an even-numbered multiple of the energization current frequency (50 Hz in the present case). This is due to the fact that the oscillation waveform is a repetitive form of 50 Hz, that is to say, the oscillation is caused by an energization current, indicating that there is only a small polarity effect.

(5) The magnitude of this oscillation remains substantially flat up to about 2 kHz with a component of about $10^{-2}$ m/s$^2$. Although not shown, the magnitude of oscillation tends to decrease with the increase in the frequency higher than 2 kHz. The noise level in this frequency range is more than $10^{-5}$ m/s$^2$, so that the oscillation component decreases below the noise level and impossible to detect for a frequency of higher than 5 kHz. This characteristic remains substantially similar depending to some degree numerically on the differences of the shape and configuration of the apparatus to be measured and the mounting position of a sensor for measurement.

(6) The oscillation waveform under stable state described in (3) above is a steady and continuous repetitive one, and non-steady noise oscillation is effectively eliminated by what is called the averaging process in which a plurality of measurement results are averaged out. The waveform under unstable state, by contrast, is subjected to large secular variations and has not any salient feature as compared with FIG. 3.

(7) An oscillation is also generated when a current is supplied to a normal contact part free of an energization fault. This is due to the electromagnetic or magnetostrictive force caused by an energization current or an induction noise, etc. directly induced in an electrical circuit for measurement. These noises are considerable and reach an unnegligible level of about $10^{-3}$ m/s$^2$ for a frequency of lower than 200 Hz, while they decrease with the increase of frequency higher than 200 Hz. These oscillation noises also present a pattern similar to FIG. 3 having a frequency peak at an integral multiple of the energization current frequency.

(8) Oscillation noises not attributable to the energization current include internal noises caused by the operation of a switch or a hydraulic pump of the operation mechanism section and external noises generated by the contact with other objects or the construction work in the surrounding areas. Both of them have a frequency pattern different from FIG. 3 but their intensity may be very high.

The fault decision algorithm and the criterion determined considering the oscillation generated in association with an energization fault and the characteristics of oscillation noises mentioned above are applied to the result of oscillation measurement thereby to detect the progress of an energization fault in initial stages with high accuracy.

A second embodiment of the present invention will be explained with reference to FIG. 16. FIG. 16 shows a typical configuration of the invention, in which a circuit breaker 101 is used as object of detection and a piezoelectric acceleration sensor 102 as an oscillation detection means. The circuit breaker 101 is so constructed that conductors 105, 105' are hermetically and insulatively supported by bushings 104, 104' and hermetic terminals 109, 109' on a tank 103 making up a hermetic housing of earth potential. The conductors 105, 105' are connected to a circuit breaker section 108 including a movable electrode 106 and a fixed electrode 107. The hermetic terminals 109, 109' are connected outside thereof to a power transmission line or other transmission or substation equipment of a power transmission system by means of external conductors 110, 110' making up a current path. The tank 103 has sealed therein an insulating gas which is normally an SF$_6$ gas at about five atmospheres in pressure. In this configuration, an energization fault by be caused may such phenomena as (i) wear or deterioration of the electrodes of the circuit breaker section due to excessive numbers of current interruption, (ii) switching failure attributable to the malfunction of the operating unit for the movable electrode, (iii) insufficient contacting force due to the deterioration of the pressure spring of the tulip contact, and (iv) shortage of bolting force of the conductor connections arising from the assembly failure. With the generation and progress of an energization fault caused by these factors, the above-mentioned oscillation occurs in comparative early stages. In order to detect this, an acceleration sensor 102 is mounted on the outer wall of the tank 103, because fault detection is desirable by external diagnosis without adversely affecting the energization reliability. The oscillation associated with the present invention comparatively large in the approximate range from 0.001 to 0.1G, and the frequency range from 200 to about 5000 Hz. Therefore, the acceleration sensors commercially available may be used without any modification. In mounting the sensor, an exclusive boss is welded to the tank 103 in advance and the sensor is secured by bolts thereto in a preferable way. In the case of portable sensor, however, it is conveniently fixed by magnet on the magnetic material of the tank 103. When mounted on the existing tank lacking bosses, the sensor may be secured by adhesive. An output signal of the acceleration sensor 102 is applied to a pre-amplifier 112 through an exclusive cable 111. For the characteristics of the acceleration sensor 102, the length of the cable 111 is normally limited to less than several meters, and therefore the pre-amplifier 112 is installed in the vicinity of the acceleration sensor 102. An output signal of the pre-amplifier 112 is sent to a cable 113, a bandpass filter 114, a cable 115 and a detector 116. In the case where the detector 116 is installed several meters or more away in a substation control room or the like, electro-optical conversion means may be used for transmission by optical fiber cable followed by optoelectric conversion in order to improve the S/N value against an external surge. The bandpass filter 114, not essential in the invention, is used to improve the S/N value and the fault detection accuracy by cutting off signals of less than 200 Hz and higher than 5000 Hz in frequency. Cutting off the former frequency band is especially effective in view of the many oscillations based on the commercial frequency and multiples thereof and caused by electro-magnetic forces or the like in the existing in the environment where the circuit breaker 101 is installed. The detector 116 may be of any type basically as far as it is capable of detecting an electrical signal of 200 Hz to 5000 Hz. For portable system with the whole unit contained in a single housing, the detector 116 may be an AC voltmeter for simple applications. It is, however, necessary to make sure that the frequency characteristics are guaranteed. Determination of the central frequency of a signal generated provides an important clue to specifying an oscillation source, and therefore a synchroscope, or preferably a spectrum analyzer is recommended.

Measurement by the acceleration sensor 102 should be desirably made at many points for assuring a high fault detection reliability. In the case of a unit circuit breaker 101 shown in FIG. 16, however, the normal object of the invention may be achieved by measurement at a single point near the center of the tank 103. In what is called the GIS (gas-insulated substation) configuration with a number of power transmission and substation equipment connected by gas-insulated bus bars, on the other hand, about one measuring point may be provided in each gas section as a normal standard.

As a fault criterion, the normal background noise is measured in advance for each measuring point, and the system is set to a level about several times higher. In the absence of such information, however, the intended object is achieved by setting to a level between 0.001 and 0.01 G.

Should an abnormal oscillation be detected, the best way to trace the source with accuracy is to measure oscillation waveforms at several peripheral points at a time and to compare the intensities thereof with each other.

After specifying the faulty point roughly in this way, the particular point may be confirmed by disassembly inspection. Since a light welding trace is left at the faulty part by an abnormal oscillation, the faulty part may be identified even with energization stopped.

Figure 20:
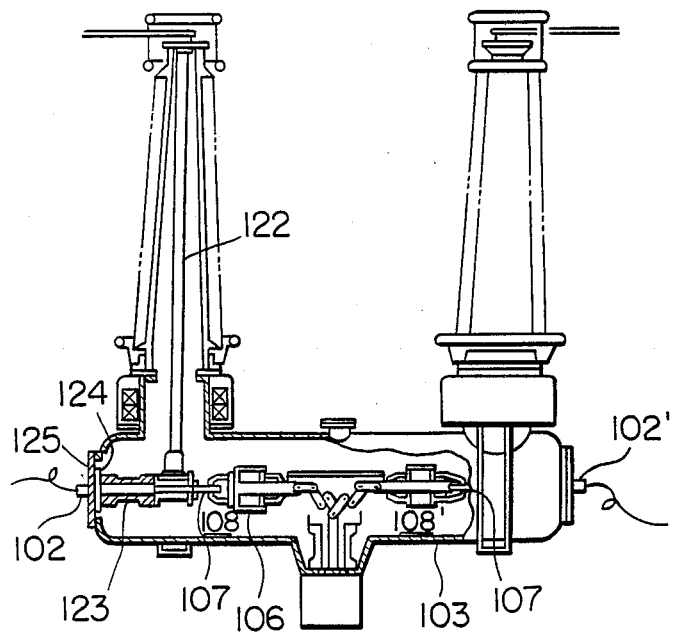
FIGS. 20, 21, 23 and 24 are schematic diagrams showing a modification of the second embodiment of the present invention.

An example of application of the present invention to a large circuit breaker 101 is shown in FIG. 20. This embodiment comprises two series-connected circuit breaker sections 108, 108' each including a movable electrode 106 and a fixed electrode 107 and therefore requires a larger tank 3, which in turn requires a couple of acceleration sensor 102, 102'. An oscillation generated at the time of energization failure of the high-potential conductors is primarily transmitted through solid parts, and therefore the acceleration sensors 102, 102' are desirably mounted at a point mechanically connected to the high-potential conductors as shown. In this embodiment, they are located on an end plate 125 of a tank flange 124 fixed to an insulating support 123 insulatively supporting the fixed-electrode conductor 122. As a result, an oscillation caused from a faulty energization part is detectable with high sensitivity by the external diagnosis process.

Figure 21:
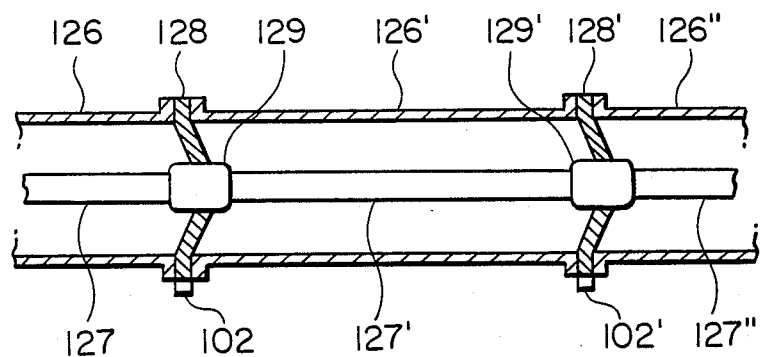

FIG. 21 shows an example of application of the present invention to a gas-insulated switchgear apparatus used in a gas-insulated switching station. Conductors 127, 127', 127" are supported by cone spacers 128, 128' and through conductors 129, 129' in sheathes 126, 126', 126". An actual gas-insulated switchgear apparatus is comprised of various switches, measuring instruments, lightning arresters and branch units in a complicated way. The whole of these devices is shown as a conductor 127 in the case under consideration for simplicity's sake. In this configuration, the cone spacers 128, 128' provide a mechanical connection unit for the high potential parts and the earth potential parts, and therefore the acceleration sensors 102, 102' are preferably installed on or in the vicinity of the cone spacers 128, 128'. A common gas-insulated apparatus has cone spacers 128, 128' make up a partition for separating adjacent gas sections, and desirably are capable of locating the position of a fault which may occur. If the gas section associated with a fault could be identified, labor is greatly saved by disassembling and checking the particular gas section alone. Installation of an acceleration sensor for each cone spacer providing a gas partition wall could facilitate identification of a gas section in fault by comparing the intensity of the signal level of oscillations detected by the acceleration sensors.

As a method of improving the fault detection accuracy according to the present invention, the S/N value instead of the detection sensitivity is improved. One of noise sources is an electromagnetic force, magnetostrictive effect or induction due to the energization current of the commercial frequency. An actual measurement shows that the intensity level of these noises forming a bottleneck to the oscillation detection intended by the present invention is in the range below 200 Hz. The intended S/N value is secured by cutting off these noises by means of a bandpass filter or the like as described above.

Figure 22:
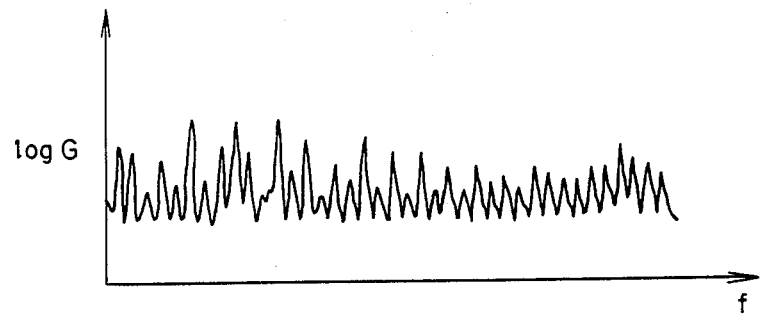
Figure 23:
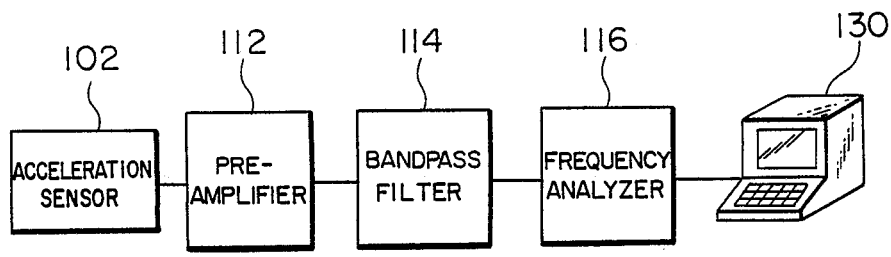

Other probable noise sources include rains, wind and contacts or collisions of human being or objects. These noises are discriminated from each other by the form of signals, and thus it is possible to improve the signal-to-noise ratio. Specifically, it is noted that while these noises are a spontaneous phenomenon attenuated within less than a second or a phenomenon such as white noises covering a wide frequency range, the oscillations covered for detection according to the present invention is a continuous phenomenon lasting more than several tens of seconds. Further, such oscillations have frequency characteristics of discontinuous spectrum as shown in FIG. 22. This coincides with the above-mentioned theory that the phenomenon of oscillation takes a repetitive waveform of a frequency double the commercial frequency and therefore the frequency characteristic is an integral multiple of a frequency twice the commercial frequency as will be understood from the above-mentioned principle of oscillation generation. The oscillation waveform shown in FIG. 22, however, contains not a few components of an integral multiple of the commercial frequency under the effect of distortion of the commercial frequency. Means for improving the fault detection accuracy based on this difference in signal form includes an example shown in FIG. 23. In FIG. 23, a signal processing unit 130 having a computation ability equivalent to the personal computer is connected in the stage subsequent to an acceleration sensor 102, a preamplifier 112, a bandpass filter 114 and a frequency analyzer 116. The signal processing unit 130 decides on a fault and generates a fault detection signal if a signal with a component of an integral multiple of the commercial frequency lasts for at least one second.

Figure 24:
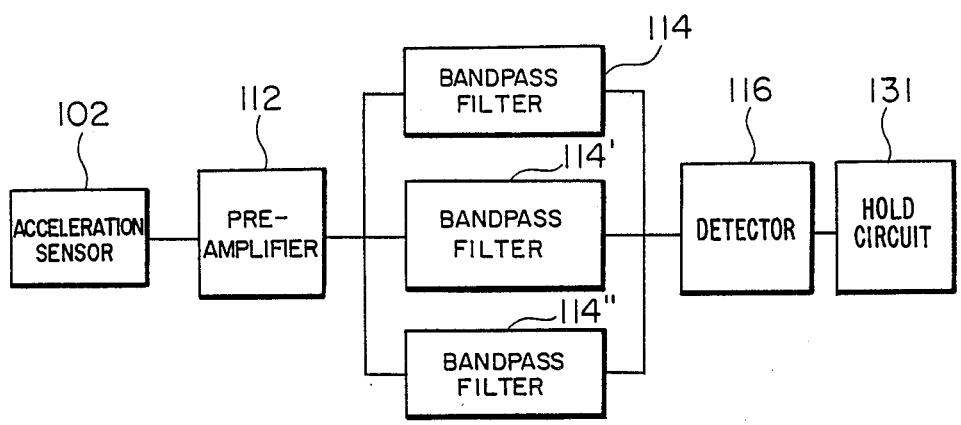

FIG. 24 shows a hardware configuration of the functions similar to those included in the afore-mentioned embodiment. In this case, bandpass filters 114, 114', 114" have a band width of as narrow as 3 Hz with the central frequency set to integral multiples of the commercial frequency, that is, 600, 900 and 1800 Hz in the present case. Although three types of bandpass filters are used in parallel for an improved detection accuracy, the number may be increased or decreased as required. A detector 116 capable of level detection is used and has an output thereof connected to a hold circuit 131. The hold circuit 131 is set in such a manner as to produce a fault detection signal upon continuation of an output signal for a predetermined length of time, say, one second as set in the present case.

A phenomenon not conventionally known and associated specifically with an energization fault is an inherent oscillation generated by an electrode. Oscillograms obtained by supplying a current of 1000 A to copper electrodes of about 1 kg in weight kept in contact under the contacting force of 2 kg and 1 kg are shown in FIGS. 17A and 17B respectively. FIG. 17A, shows a normally energized state and plots an energization current waveform 117, an interpole voltage waveform 118 and a tank oscillation waveform 119 against time t. Under normal energization, the interpole voltage waveform 118 is substantially sinusoidal like the sinusoidal current waveform 117, and the tank oscillation waveform 119 has a commercial frequency (50 Hz in this case) of substantially sinusoidal form with a peak value of about 0.001 G (G: Gravitational acceleration). This oscillation is considered due to the electromagnetic force or induction caused by the energization current. In comparison, at the time of a fault as shown in FIG. 17B, the interpole voltage waveform 118 is considerably distorted in spite of the energization current 117 being sinusoidal in waveform. Especially this trend is conspicuous and the voltage is likely to increase at points immediately before and following a zero current point. At the same time, an oscillation of about 0.1G in maximum is detected centered at about 500 Hz from the tank oscillation waveform. The result of frequency analysis of this oscillation waveform indicates a frequency component distributed over a range up to a maximum of 5000 Hz.

Figure 19:
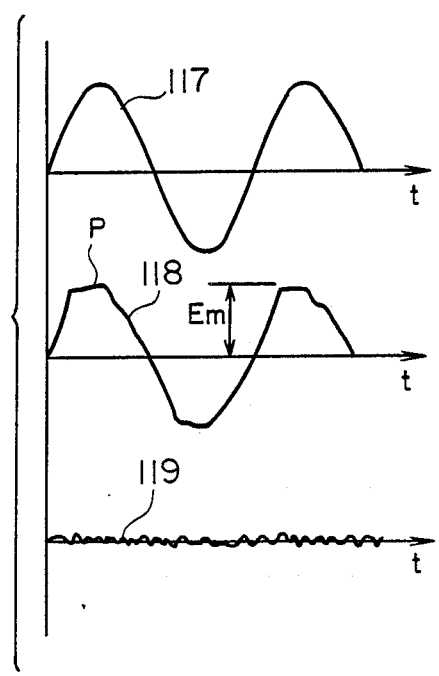

The aforementioned waveform is an example often observed with a copper electrode. In the aluminum, silver or silver-plated electrode, on the other hand, a voltage waveform as shown in FIG. 19 different from that for the copper electrode is generated at the time of energization fault. In comparison with the energization current 117 of sinusoidal form, the voltage waveform 118 is also substantially sinusoidal with a flat portion P near the peak value. The tank oscillation waveform 119 also has similar frequency characteristics with a maximum value smaller by one order at about 0.01 G.

Figure 18:
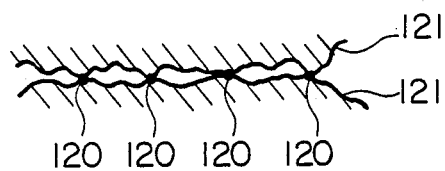
FIG. 18 is a sectional view of the essential parts for explaining the operation of the embodiment shown in FIG. 17.

A conventional interpretation of the interpole voltage is presented, for example, in "Electric Contact Techniques" by Kinya Tsuchiya, published from Sogo Denshi Shuppansha July 1980 as explained below. The surface of electrodes 121, even machined to mirror surface, microscopically carries fine unevennesses as shown in FIG. 18, and an energization surface is an aggregation of point contacts 120. As a result, the energization current flows mainly through the point contacts, which are consequently heated locally to a high temperature. With the time constant of $10^{-4}$ seconds, the temperature of the point contacts 120 changes rapidly with the current of commercial frequency, and undergoes a change at proportionate rate following the energization current. The contact resistance, however, undergoes a dynamic change under the effect of changes in the resistivity of the electrode material with temperature and the local expansion or contraction due to temperature changes. As a result, the temperature of the contact points 120 keeps an almost proportional relationship with the interpole voltage in the ratio of one to one. The fusion welding of the point contacts 120, on the other hand, takes place as the temperature thereof exceeds the melting temperature of the contact material. This is expressed by an interpole voltage of 0.43V for copper electrode and 0.3V for aluminum electrode, as an example. The maximum value Em shown in FIGS. 17B and FIG. 19 substantially coincides with this value, indicating that the welding of the electrode material is slowly progressing at this time point. An inspection after current supply shows that these electrodes carry a light welding trace.

From this information, the facts that are mentioned below are inferred as a cause of oscillation at the time of energization fault. At the peak value of voltage, the temperature of the point contacts 120 rises to about the melting temperature of the material, while at the zero current point, it decreases to the temperature level of the electrode bulk (normally several tens of degree). At the same time, a cycle of sharp expansion and contraction due to temperature changes occurs at or in the vicinity of the contact points 120, thus causing a local interpole collision. This collision is transmitted through the solids to and perceived by an oscillation detector installed on the outer wall of the tank. As obvious from the above explanation, the inclination of the voltage waveform of FIG. 17B (change rate with temperature) in the vicinity of the zero current point is larger than that in FIG. 19, so that the sharp collision phenomenon is considered to lead to a higher level of detection of the oscillation 119. In view of the fact that the above-mentioned phenomenon is a repetition of the commercial frequency, the frequency component of the oscillation waveform 119 is considered to exhibit repetitive frequency characteristics with a component of an integral multiple of the commercial frequency. This fact has also be confirmed by actual measurements, indicating that the above-mentioned inference on the cause of oscillation is right.

Figure 25:
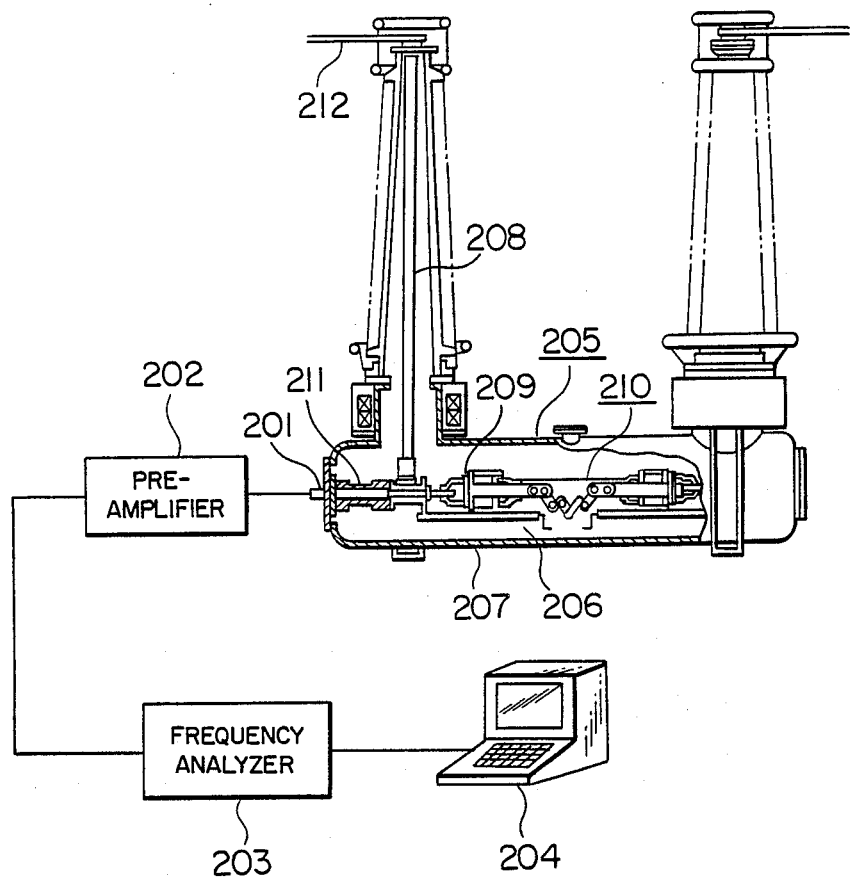
FIG. 25 is a schematic diagram showing a general configuration of a third embodiment of the present invention.

A third embodiment of the present invention will be explained below with reference to FIG. 25. In FIG. 25, an example of an energization fault detection system comprising an acceleration sensor 201, a preamplifier 202, a frequency analyzer 203 and a processing unit 204 as applied to a gas-insulated circuit breaker 205 is shown. The gas-insulated circuit breaker, 205 comprises a tank 207 making up a hermetic case having sealed therein a quenching gas (generally, an $SF_6$ gas) 206 high in insulation performance and a high-potential member 210 made up of a conductor 208 and a circuit breaker section 209 insulatively supported in the tank 207. Upon operation of the power system, a current is introduced by way of an external conductor 212. At this time, if the high potential part 210 has any part failing in contact, an oscillation is caused by the above-mentioned mechanism. This oscillation is propagated to the tank 207 through the metal material constituting the high-potential member 210 and the insulative support cylinder 211 supporting the high-potential part 210. As a result, if the acceleration sensor 201 is mounted in the vicinity of the insulative support cylinder 211 mechanically coupled to the high-potential member 210, an oscillation can be detected with high sensitivity. A higher sensitivity could be obtained by installing the acceleration sensor 201 at the high-potential member 210 and transmitting a signal by insulation with an optical fiber or the like. Nevertheless, giving priority to the reliability of the circuit breaker, it is common practice in the present preventive maintenance to install sensors outside the tank 207. The acceleration sensor 201 may be mounted either by bolting, adhesive or magnet, and should preferably be installed as firmly as possible in view of the requirement of measurement. In applications of the present invention, the acceleration sensor 201 is often mounted semipermanently desirably by bolting. The mount of the acceleration sensor 201 is preferably protected by a cover in order to reduce the external noises due to the elements as well as to attain the object of the invention. Such a protective cover, however, is not shown in the drawing. If a piezo-electric sensor is used as an acceleration sensor 201, for example, a pre-amplifier 202 such as a charge amplifier is required for amplifying the quantity of generated charge. In the case where an acceleration sensor 201 with a built-in amplifier is used, on the other hand, a drive power supply is used in place of the pre-amplifier. The output of the pre-amplifier 202 is applied to the frequency analyzer 203, and then to the processing unit 204 such as the personal computer in the form of an oscillation component separated by frequency. Generally, a preventive maintenance system for power substation equipment covers a multiplicity of items of a multiplicity of units for detection, and therefore a processing unit in some form or other is used in order to coordinate and control these signals. The functions of the processing unit 204 according to the present invention may also be incorporated in such a processing unit. The functions of the frequency analyzer 203 may be performed by the processing unit 204 with a built-in software. An exclusive unit 204 assures a high-speed computation and therefore is included in the configuration shown.

Figure 28:
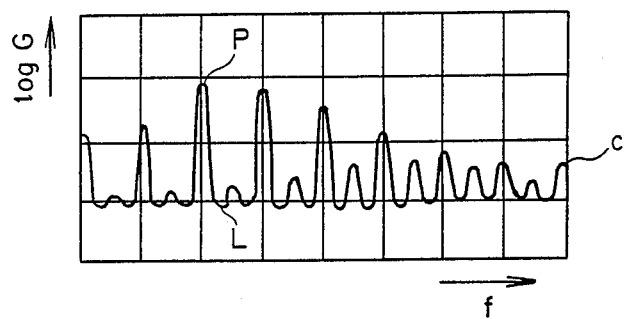
FIGS. 27 and 28 are diagrams showing the principle of the present invention.
Figure 27:
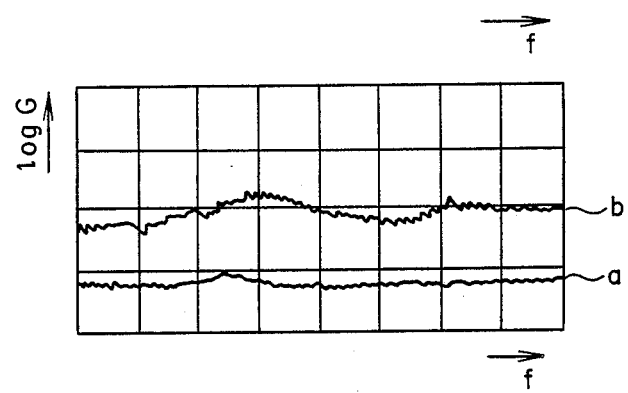

Output waveforms of the frequency analyzer 203 are shown in FIGS. 27 and 28. The abscissa represents the frequency f, and the ordinate the logarithm of the oscillation intensity G. The character a in FIG. 27 designates a state of normal energization in which an external noise is comparatively small. The frequency range of lower than 200 Hz contains an induction, electromagnetic force or the like caused by an energization current of commercial frequency and is not suitable for fault detection, and therefore the diagram indicates a frequency range of higher than 200 Hz. The waveform b in FIG. 27 designates a case affected by an external noise such as the elements and is shifted upward of the waveform a. As a result, if a given value is set as a criterion for energization fault detection so that a fault is decided on when the signal level exceeds such a value, therefore, a false operation may result under a high level of an external noise and a considerable risk is posed. The waveform c of FIG. 28 is associated with an energization fault. As shown, frequencies of even-numbered multiples of the frequency of the energization current contain a large oscillation component, while the frequency component of odd-numbered multiples is comparatively small. There are bottoms between these two multiples involving small oscillation components. If an external noise such as that of the elements is superimposed on the waveform of energization fault shown in FIG. 28, the resulting waveform is one shifted upward of the waveform of FIG. 28. The criterion for detection of an energization fault, therefore, should be the order of times by which the even-numbered multiple P of the frequency of the energization current is higher than the value L between adjacent integral multiples. Specific values of such an order should be two to ten, and as a means of improving the detection reliability, similar verification should be conducted on a plurality of peaks with the results applied to an AND or OR circuit.

Figure 26:
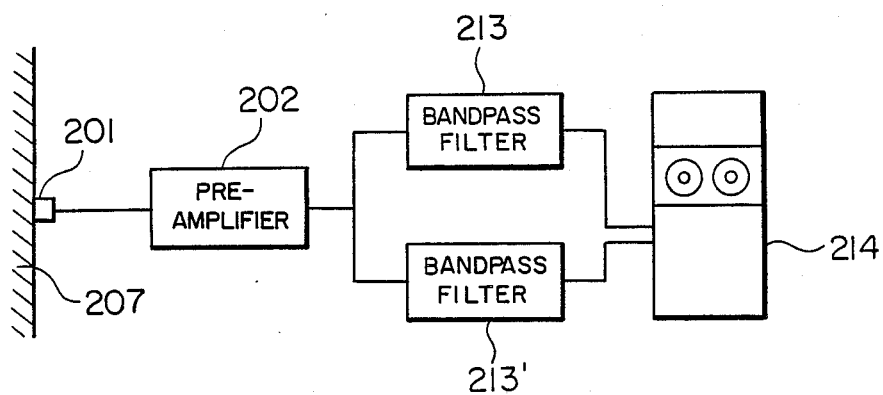
FIG. 26 is a schematic diagram showing a modification of the third embodiment.

FIG. 26 shows a low-cost configuration meeting a case involving a number of detection points including gas-insulated switchgear stations. As in the preceding embodiment, an acceleration sensor 201 is installed on the outer wall of a tank 207, and the signal from the sensor 201 is passed through a pre-amplifier 202 and processed by narrow-bandwidth filters 213, 213'. The central frequencies of the bandpass filters 213 and 213' are set to points P and L in FIG. 4. For simplification, the bandpass filters 213 and 213' may be constructed of tuning circuits.

As a result of an energization test using an energization fault contactor, an audible sound is generated from the contact point, and can be caught as an oscillation if an acceleration sensor is installed on the housing. The oscillation appears to be generated by the cause mentioned below. A model contact point, though apparently in surface contact, is considered to consist of numerous point contacts of several μm to several tens of μm at the real energization part. At the contact points of energization fault, the total area of the real point contacts is insufficient against the energization current for such reasons as the lack of contacting force, and the areas at or near the contact are overheated by excessive current concentration. The time constant of temperature change at or near the real contact point is considered to be $10^{-3}$ to $10^{-4}$ seconds, which represents a sufficiently high rate of change with the energization current of the commercial frequency. Specifically, the temperature of the real contact point can follow with sufficient margin the change of the commercial frequency of the energization current with time, thus forming a balanced state. This indicates that two overheatings occur in correspondence to the two maximum current values taking place during a cycle of energization current, and two coolings are rendered in correspondence to two zero current points. As a consequence, it appears that expansion and contraction are repeated at a frequency twice higher than the energization current with the result that both electrodes collide with each other at high speed, thereby causing an oscillation in the areas at or near the real contact point. In fact, an actual measurement of this oscillation waveform and frequency analysis shows a discontinuous spectrum with main components of double frequencies of the energization current. This indicates that the waveform obtained is a repetitive waveform of double frequencies of the energization current. Probably because of the polarity effect, however, the waveform contains some components of the same frequency as the energization current.

The problem background noises at the site of a power substation are of three types including those caused by the electromagnetic force due to the energization current, spontaneous ones caused by the operation of a circuit breaker or the like and continuous ones attributable to ,the elements such as rains and storms. The background noises due to the electromagnetic force generally contain an oscillation component of less than 200 to 400 Hz. The oscillation component associated with an energization fault is generally in a higher frequency range, and therefore can be easily removed through a high-pass filter. The signal component of the spontaneous noises is generally continuous for several seconds or longer and can be removed by software with a simple algorithm such as an averaging process along the time axis. The noises caused by the elements, on the other hand, are comparatively large in signal level and are represented by a continuous signal, thus posing a problem. Actual analysis by measuring the waveform shows, however, that the waveform lacks a regularity and the frequency component is a continuous spectrum. In view of the fact that the oscillation waveform for an energization fault is a spectrum having discontinuous values, this spectral difference may be used to separate them from each other and thus to improve the detection accuracy of an energization fault.

We claim:

1. A contact abnormality detection system for use in a power transmission or distribution apparatus comprising a hermetic housing and conductors in the housing having contacts for providing a path for a large current and being electrically insulated form the housing, the contact abnormality detection system comprising:

vibration detecting means for detecting vibrations generated by the power transmission or distribution apparatus, wherein the vibrations comprise vibrations generated by the contacts when the contacts exhibit a contact abnormality and a large current flows through the contacts exhibiting the contact abnormality;

vibration analyzing means for detecting if the vibrations detected by the vibration detecting means have a frequency component within a predetermined frequency range; and contact abnormality decision means for deciding that the contacts exhibit a contact abnormality when the vibration analyzing means detects that the vibrations detected by the vibration detecting means have a frequency component in the predetermined frequency range.

2. A contact abnormality detection system according to claim 1, wherein the power transmission or distribution apparatus is a gas-insulated switchgear, and further comprises an insulating gas sealed in the housing.

3. A contact abnormality detection system according to claim 2, wherein the frequency component detected by the vibration analyzing means within the predetermined frequency range is at a frequency which is an integral multiple of a fundamental frequency of a current flowing through the contacts.

4. A contact abnormality detection system according to claim 3, wherein the predetermined frequency range is 200 to 5000 Hz.

5. A contact abnormality detection system for use with a gas-insulated switchgear comprising a hermetic housing, an insulating gas sealed in the housing, and conductors int he housing having contacts for providing a path for a large current and being electrically insulated form the housing, the contact abnormality detection system comprising:

vibration detecting means for detecting vibrations generated by the gas-insulated switchgear, wherein the vibrations comprise vibrations generated by the contacts when the contacts exhibit a contact abnormality and a large current flows through the contacts exhibiting the contact abnormality;

vibration analyzing means for detecting if the vibrations detected by the vibration detecting means have a frequency component within a predetermined frequency range of 200 to 5000 Hz by detecting one of a peak value and an average value of frequency components within the predetermined frequency range at frequencies which are integral multiples of a fundamental frequency of a current flowing through the contacts; and contact abnormality decision mean for deciding that the contacts exhibit a contact abnormality when the vibration analyzing means detects that the vibrations detected by the vibration detecting means have a frequency component within the predetermined frequency range.

6. A contact abnormality detection system for use in a gas-insulated switchgear comprising a hermetic housing, an insulating gas sealed in the housing, and conductors in the housing having contacts for providing a path for a large current and being electrically insulated form the housing, the contact abnormality detection system comprising:

vibration detecting means for detecting vibrations generated by the gas-insulated switchgear, wherein the vibrations comprise vibrations generated by the contacts when the contacts exhibit a contact abnormality and a large current flows through the contacts exhibiting the contact abnormality;

comparing means for comparing a first frequency component of the vibrations detected by the vibration detecting means within a predetermined frequency range to a second frequency component of the vibrations detected by the vibration detecting means within the predetermined frequency range, wherein the first frequency component is at a first frequency which is an even integral multiple of a fundamental frequency of a current flowing through the contacts and the second frequency component is at a second frequency which is between the first frequency and a third frequency adjacent to the first frequency which is an odd integral multiple of the fundamental frequency; and contact abnormality decision means for deciding that the contacts exhibit a contact abnormality when a ratio of the first and second frequency components compared by the comparing means exceeds a predetermined value at least equal to two.

7. A contact abnormality detection system according to claim 6, wherein the predetermined frequency range is 200 to 5000 Hz.

8. A contact abnormality detection system for use in a gas-insulated switchgear comprising a hermetic housing, an insulating gas sealed in the housing, and conductors in the housing having contacts for providing a path for a large current and being electrically insulated from the housing, the contact abnormality detection system comprising:

vibration detecting means for detecting vibrations generated by the gas-insulated switchgear, wherein the vibrations comprise vibrations generated by the contacts when the contacts exhibit a contact abnormality and a large current flows the contacts exhibiting the contact abnormality;

comparing means for comparing one of a peak value of first frequency components of the vibrations detected by the vibration detecting means within a predetermined frequency range of 200 to 5000 Hz to a minimum value of second frequency components of the vibrations detected by the vibration detecting means within the predetermined frequency range and an average value of the first frequency components to an average value of the second frequency components, wherein the first frequency components are at first frequencies which are even integral multiples of a fundamental frequency of a current flowing through the contacts and the second frequency components are at second frequencies which are between the first frequencies and third frequencies adjacent to the first frequencies which are odd integral multiples of the fundamental frequency; and contact abnormality decision means for deciding that the contacts exhibit a contact abnormality when a ratio of the values compared by the comparing means exceeds a predetermined value greater at least equal to two.

* * * * *